(12) United States Patent
Liu et al.

(10) Patent No.: US 8,242,503 B2
(45) Date of Patent: Aug. 14, 2012

(54) MULTI-GATE THIN FILM TRANSISTOR DEVICE

(75) Inventors: Yu-Chung Liu, Kaohsiung (TW); Te-Yu Lee, Zhubei (TW)

(73) Assignee: Chimei Innolux Corporation, Chu-Nan (TW)

( * ) Notice: Subject to any disclaimer, the term of this patent is extended or adjusted under 35 U.S.C. 154(b) by 0 days.

(21) Appl. No.: 13/042,861

(22) Filed: Mar. 8, 2011

(65) Prior Publication Data
US 2011/0284851 A1 Nov. 24, 2011

Related U.S. Application Data

(60) Provisional application No. 61/347,093, filed on May 21, 2010.

(30) Foreign Application Priority Data

Sep. 1, 2010 (TW) .............................. 99129445 A

(51) Int. Cl.
H01L 33/00 (2010.01)
(52) U.S. Cl. .................................. 257/59; 257/E29.273
(58) Field of Classification Search ..................... 257/59, 257/72, E29.273, 359
See application file for complete search history.

(56) References Cited

U.S. PATENT DOCUMENTS

| | | | | |
|---|---|---|---|---|
| 5,459,595 A | * | 10/1995 | Ishiguro et al. | 349/111 |
| 5,459,596 A | * | 10/1995 | Ueda et al. | 349/39 |
| 5,600,461 A | * | 2/1997 | Ueda et al. | 349/38 |
| 6,064,451 A | * | 5/2000 | Oh et al. | 349/40 |
| 6,317,175 B1 | * | 11/2001 | Salerno et al. | 349/45 |
| 6,980,264 B2 | * | 12/2005 | Lee et al. | 349/54 |
| 7,163,848 B2 | * | 1/2007 | Yamazaki et al. | 438/149 |
| 7,514,302 B2 | * | 4/2009 | Yamazaki et al. | 438/149 |
| 2004/0169781 A1 | * | 9/2004 | Lee et al. | 349/54 |
| 2008/0036355 A1 | * | 2/2008 | Chan et al. | 313/326 |
| 2008/0074587 A1 | * | 3/2008 | Tien et al. | 349/106 |
| 2009/0059174 A1 | * | 3/2009 | Shirasaka et al. | 353/20 |
| 2009/0101913 A1 | * | 4/2009 | Shih et al. | 257/72 |
| 2009/0237600 A1 | * | 9/2009 | Nagai et al. | 349/114 |
| 2009/0303407 A1 | * | 12/2009 | Lee | 349/44 |
| 2010/0065851 A1 | * | 3/2010 | Makita | 257/72 |

* cited by examiner

*Primary Examiner* — Nathan Ha
(74) *Attorney, Agent, or Firm* — Liu & Liu

(57) ABSTRACT

A system for displaying images includes a multi-gate thin film transistor (TFT) device including an active layer, first and second gate structures, and first and second light-shielding layers. The active layer is disposed on a substrate in a pixel region. The first and second gate structures are disposed on the active layer. The first and second light-shielding layers are disposed between the substrate and the active layer. The active layer includes first and second source/drain regions and first and second channel regions. The first light-shielding layer corresponds to a first lightly doped region and laterally extends under at least a portion of the first channel region. The second light-shielding layer corresponds to the second lightly doped region and laterally extends under at least a portion of the second channel region.

20 Claims, 6 Drawing Sheets

MULTI-GATE THIN FILM TRANSISTOR DEVICE

CROSS REFERENCE TO RELATED APPLICATIONS

This application claims the benefit of U.S. Provisional Application No. 61/347,093, filed May 21, 2010, the entirety of which is incorporated by reference herein, and this application claims priority of Taiwan Patent Application No. 099129445, filed on Sep. 1, 2010, the entirety of which is incorporated by reference herein.

BACKGROUND OF THE INVENTION

1. Field of the Invention

The invention relates to a thin film transistor (TFT) device, and in particular to a multi-gate TFT device having light-shielding layers for an active matrix flat panel display (FPD).

2. Description of the Related Art

The demand for active-matrix flat panel displays, such as an active matrix liquid crystal display (AMLCD), has increased rapidly in recent years. AMLCDs typically employ thin film transistor (TFT) devices as pixel and driving circuit switching elements which are classified as amorphous silicon (a-Si) TFTs and polysilicon TFTs according to the materials used as an active layer.

Such a TFT device typically includes a gate electrode and an active layer having a channel region, a source region, and a drain region and has been used as an element applying a voltage responsive to image information to a pixel electrode. However, when the TFT device in the pixel region is operated in an OFF state and the light (e.g., the backlight) impinges on the active layer, electron-hole pairs may be created in the active layer so as to generate photo leakage current (i.e., light-induced off-current), such that the image quality of the active-matrix flat panel display is reduced.

BRIEF SUMMARY OF THE INVENTION

A detailed description is given in the following embodiments with reference to the accompanying drawings. Systems for displaying images are provided. An exemplary embodiment of a system for displaying images comprises a multi-gate thin film transistor device comprising a substrate having a pixel region. An active layer is disposed on the substrate in the pixel region and comprises a first source/drain region, a second source/drain region, a first channel region, a second channel region, and a channel connection region, wherein the first channel region adjoins a first lightly doped region of the first source/drain region with a third lightly doped region of the channel connection region, and the second channel region adjoins a second lightly doped region of the second source/drain region with a fourth lightly doped region of the channel connection region. A first gate structure and a second gate structure are disposed on the active layer and correspond to the first and second channel regions, respectively, wherein the first and second gate structures are electrically connected to each other. A first light-shielding layer and a second light-shielding layer are disposed between the substrate and the active layer, wherein the first light-shielding layer corresponds to the first lightly doped region and laterally extends under at least a portion of the first channel region, and the second light-shielding layer corresponds to the second lightly doped region and laterally extends under at least a portion of the second channel region.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 1:
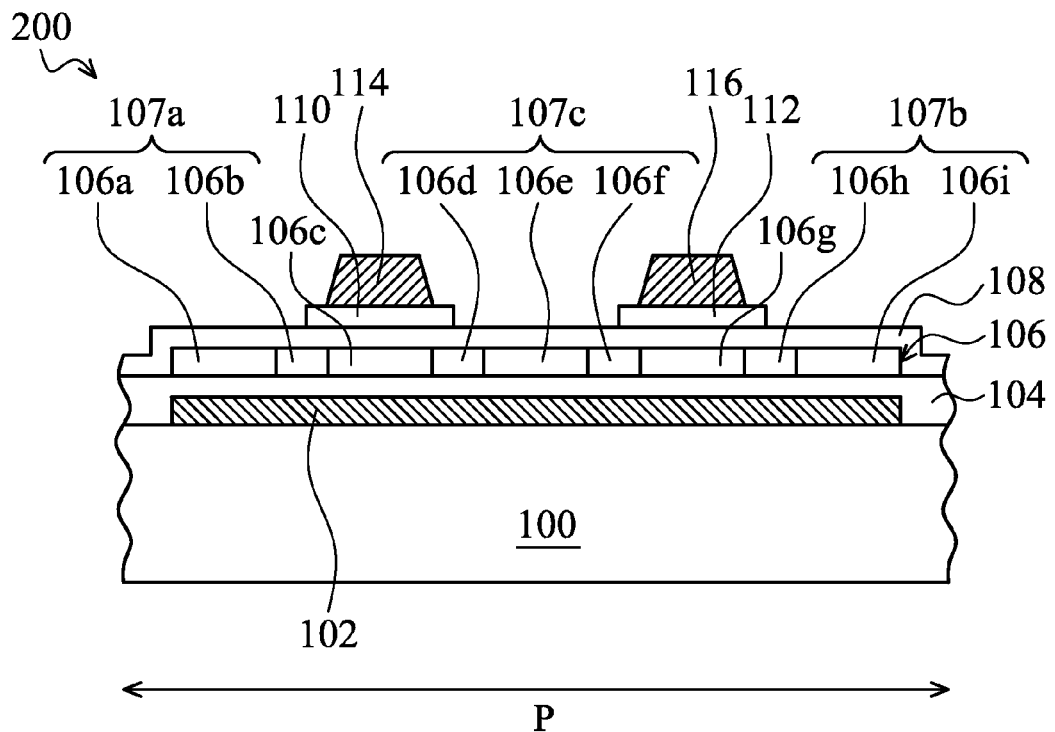
FIGS. 1 to 7 is a cross section view of various exemplary embodiments of a system for displaying images, including a multi-gate TFT device, according to the invention.

Systems for displaying images are provided. FIG. 1 illustrates an embodiment of a system for displaying images according to the invention, and in particular to a system for displaying images, including a multi-gate thin film transistor (TFT) device 200, in which the multi-gate TFT device 200 may be n-type or p-type and may comprise a substrate 100 having a pixel region P. The substrate 100 may comprise quartz, glass or other transparent materials. A buffer layer 104 may be optionally disposed on the substrate 100 to serve as an adhesion layer or a contamination barrier layer between the substrate 100 and the subsequent active layer. The buffer layer 104 may be a single layer or multiple layers. For example, the buffer layer 104 may comprise silicon oxide, silicon nitride, or a combination thereof.

An active layer 106 is disposed on the substrate 100 in the pixel region P. The active layer 106 may be formed of amorphous silicon or polysilicon. In the embodiment, the active layer 106 may comprise a first source/drain region 107a, a second source/drain region 107b, a first channel region 106c, a second channel region 106g, and a channel connection region 107c for connecting between the first and second channel regions 106c and 106g. In one embodiment, the first source/drain region 107a serves as a source of the multi-gate TFT device 200, and the second source/drain region 107b serves as a drain of the multi-gate TFT device 200. In another embodiment, the first source/drain region 107a serves as a drain of the multi-gate TFT device 200, and the second source/drain region 107b serves as a source of the multi-gate TFT device 200. In the embodiment, the first source/drain region 107a comprises a first heavily doped region 106a and a first lightly doped region 106b, and the second source/drain region 107b comprises a second heavily doped region 106i and a second lightly doped region 106h. Moreover, the channel connection region 107c comprises a third heavily doped region 106e, a third lightly doped region 106d, and a fourth lightly doped region 106f. The first channel region 106c adjoins the first lightly doped region 106b with the third lightly doped region 106d, and the second channel region 106g adjoins the second lightly doped region 106h with the fourth lightly doped region 106f.

A first gate structure and a second gate structure are disposed on the active layer 106 and correspond to the first and second channel regions 106c and 106g, respectively, in which the first and second gate structure are electrically connected to each other. The first gate structure comprises a stack of at least one gate dielectric layer and a gate layer 114. In one embodiment, the gate dielectric layer may comprise an insulating layer 108 formed of silicon oxide and an overlying insulating layer 110 formed of silicon nitride. Also, the second gate structure comprises a stack of at least one gate dielectric layer (e.g., the insulating layer 108 and the overlying insulating layer 112 formed of silicon nitride) and a gate layer 116.

In the embodiment, in order to eliminate or reduce the photo leakage current generated due to the backlight (not shown) under the substrate impinging upon the active layer 106, a light-shielding layer 102 is disposed between the substrate 100 and the buffer layer 104 under the active layer 106, so as to entirely shield the active layer 160 from impingement. The light-shielding layer 102 may comprise metal, semiconductor (e.g., silicon) or other light-absorbing materials.

In the foregoing embodiment, note that the multi-gate TFT device 200 has two gates and two channel regions for an exemplary description. The amount of gates and channel regions, however, are based on design demands and are not limited thereto.

Figure 2:
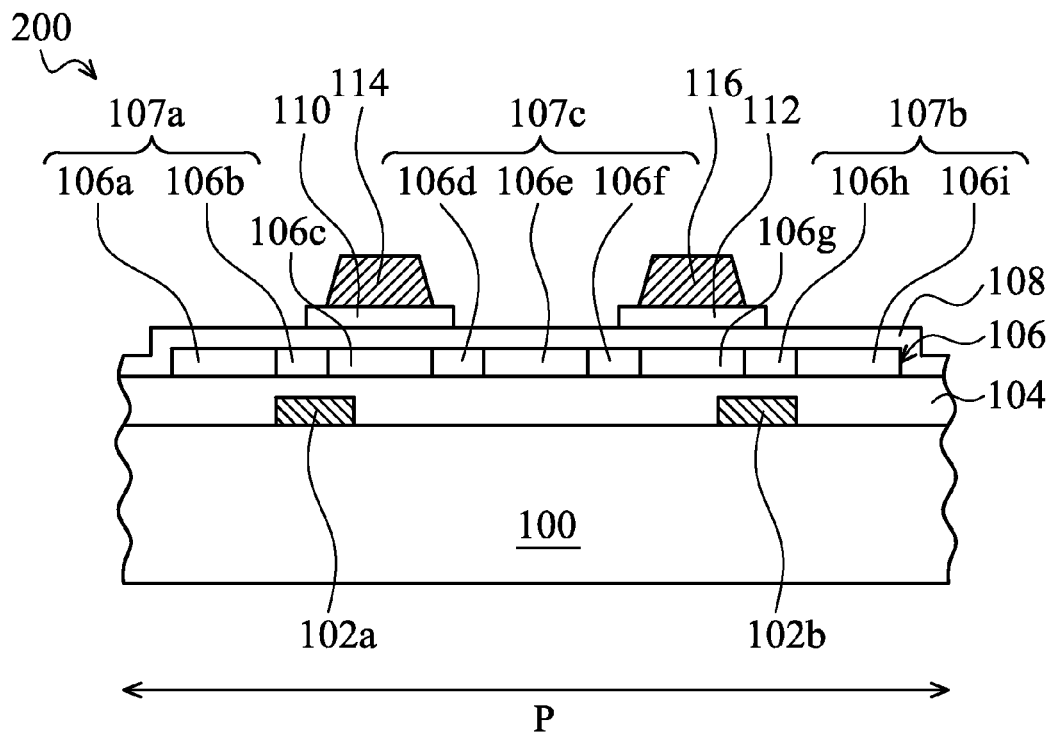

FIGS. 2 to 7 illustrate various exemplary embodiments of a system for displaying images, including a multi-gate TFT device, according to the invention. Elements in FIGS. 2 to 7 that are the same as those in FIG. 1 are labeled with the same reference numbers as in FIG. 1 and are not described again for brevity. Referring to FIG. 2, unlike the embodiment shown in FIG. 1, the multi-gate TFT device 200 has a first light-shielding layer 102a and a second light-shielding layer 102b separated from each other and disposed between the substrate 100 and the active layer 106. Particularly, the first light-shielding layer 102a corresponds to the first lightly doped region 106b and laterally extends under at least a portion of the first channel region 106c, and the second light-shielding layer 102b corresponds to the second lightly doped region 106h and laterally extends under at least a portion of the second channel region 106g. First and second light-shielding layers 102a and 102b may be formed of the same or similar material as that of the light-shielding layer 102 (shown in FIG. 1). In the embodiment, the first and second light-shielding layers 102a and 102b entirely shield the first and second lightly doped regions 106b and 106h and partially shield the first and second channel regions 106c and 106g, so as to expose the channel connection region 107c. Since serious photo leakage current is easily generated at the first lightly doped region 106b in the first source/drain region 107a and the second lightly doped region 106h in the second source/drain region 107b, the arrangement of the first and second light-shielding layers 102a and 102b according the embodiment can effectively reduce photo leakage current in the active layer 106. In another embodiment, the first and second light-shielding layers 102a and 102b may further extend to entirely shield the first and second channel regions 106c and 106g.

Figure 8:
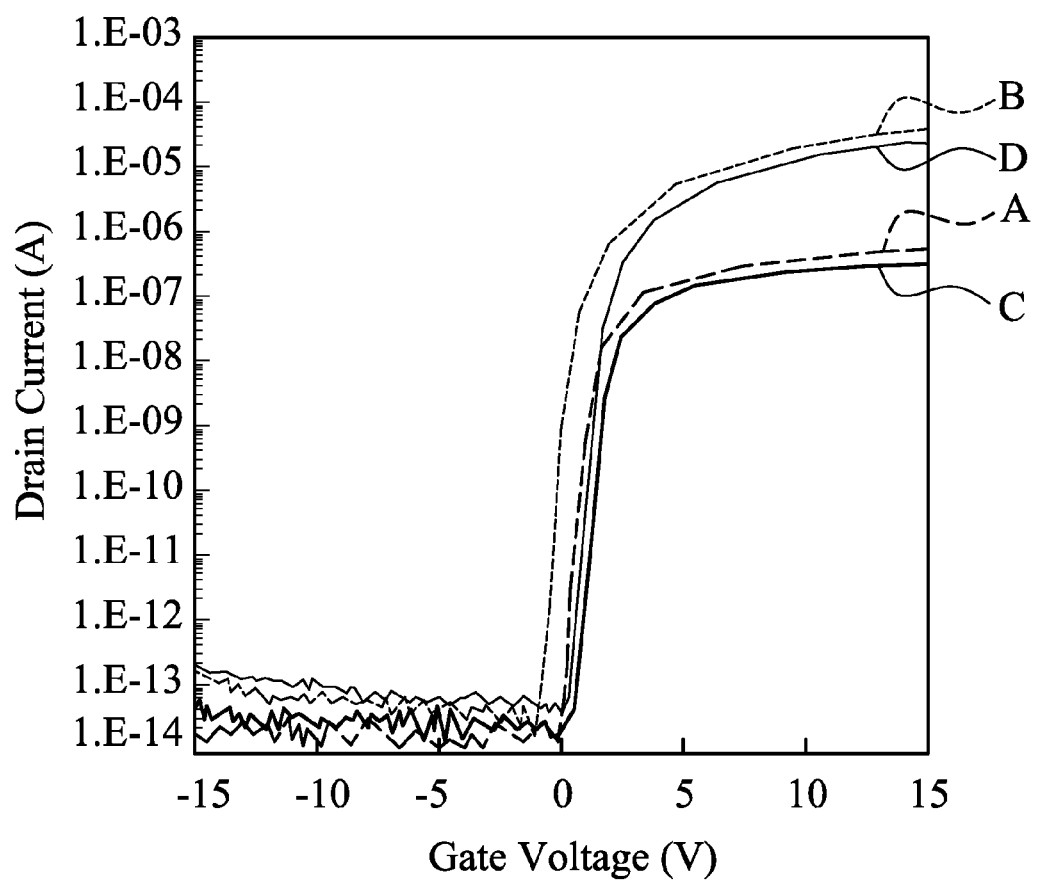
FIG. 8 is a diagram of drain current-gate voltage transfer curves.

FIG. 8 illustrates drain current-gate voltage ($I_d$-$V_g$) transfer curves, in which curves A and B represent the transfer curves of the multi-gate TFT device 200 in FIG. 1 as drain-source voltages ($V_{ds}$) are 0.1V and 10V, respectively, and curves C and D represent the transfer curves of the multi-gate TFT device 200 in FIG. 2 as drain-source voltages ($V_{ds}$) are 0.1V and 10V, respectively. Due to the coupling effect between the light-shielding layer 102 and the active layer 106 (as shown in FIG. 1), the threshold voltage ($V_{th}$) is shifted as the device is operated under a relatively low drain-source voltage ($V_{ds}$) and a relatively high drain-source voltage ($V_{ds}$), as indicated by curves A and B. However, the separated first and second light-shielding layers 102a and 102b mitigate the coupling effect, such that the threshold voltage ($V_{th}$) is almost the same as the device is operated under a relatively low drain-source voltage ($V_{ds}$) and a relatively high drain-source voltage ($V_{ds}$), as indicated by curves C and D.

Figure 3:
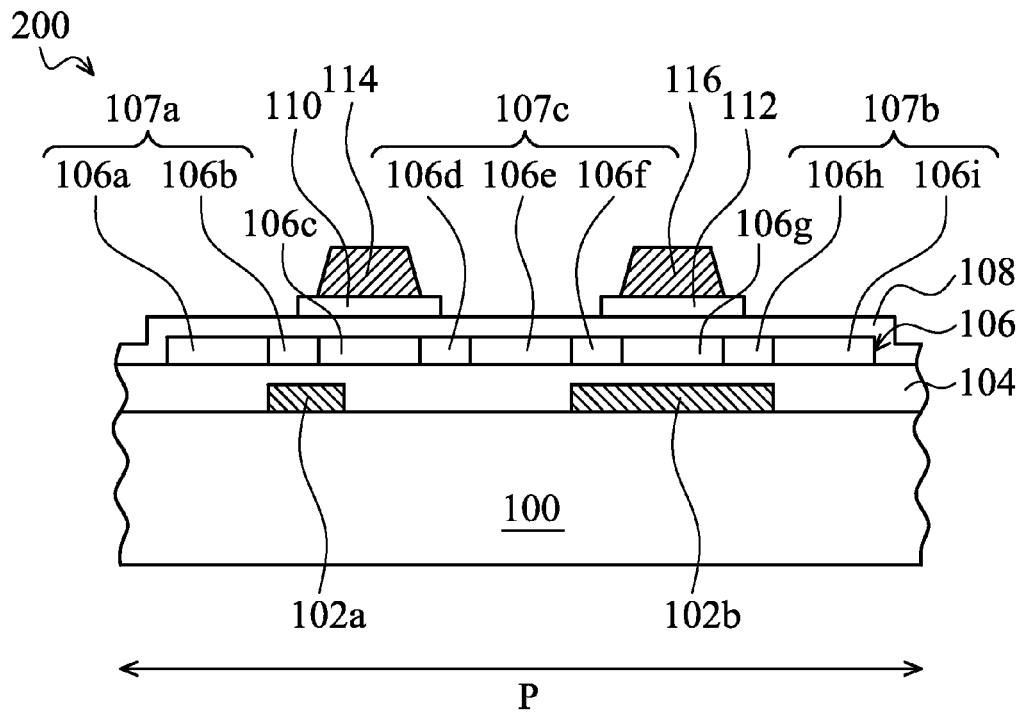
Figure 4:
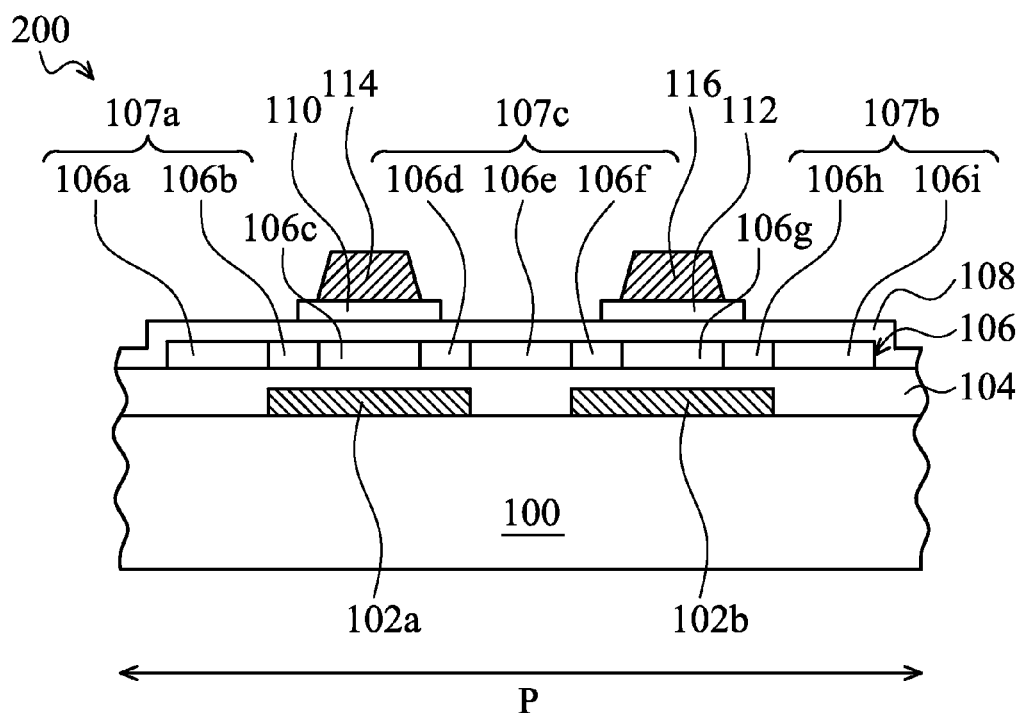

Referring to FIG. 3, unlike the embodiment shown in FIG. 2, the second light-shielding layer 102b passes under the second channel region 106g to laterally extend under the fourth lightly doped region 106f, thereby entirely shielding the second channel region 106g and the fourth lightly doped region 106f from impingement. In another embodiment, the first light-shielding layer 102a also passes under the first channel region 106c to laterally extend under the third lightly doped region 106d, thereby entirely shielding the first channel region 106c and the third lightly doped region 106d, as shown in FIG. 4.

Figure 5:
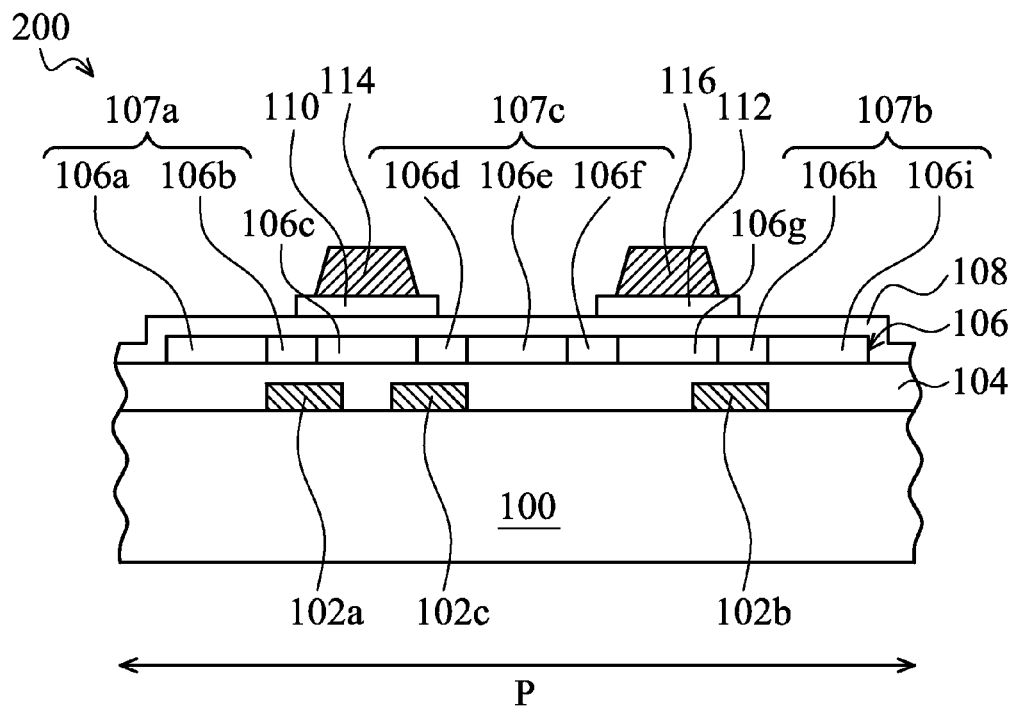
Figure 6:
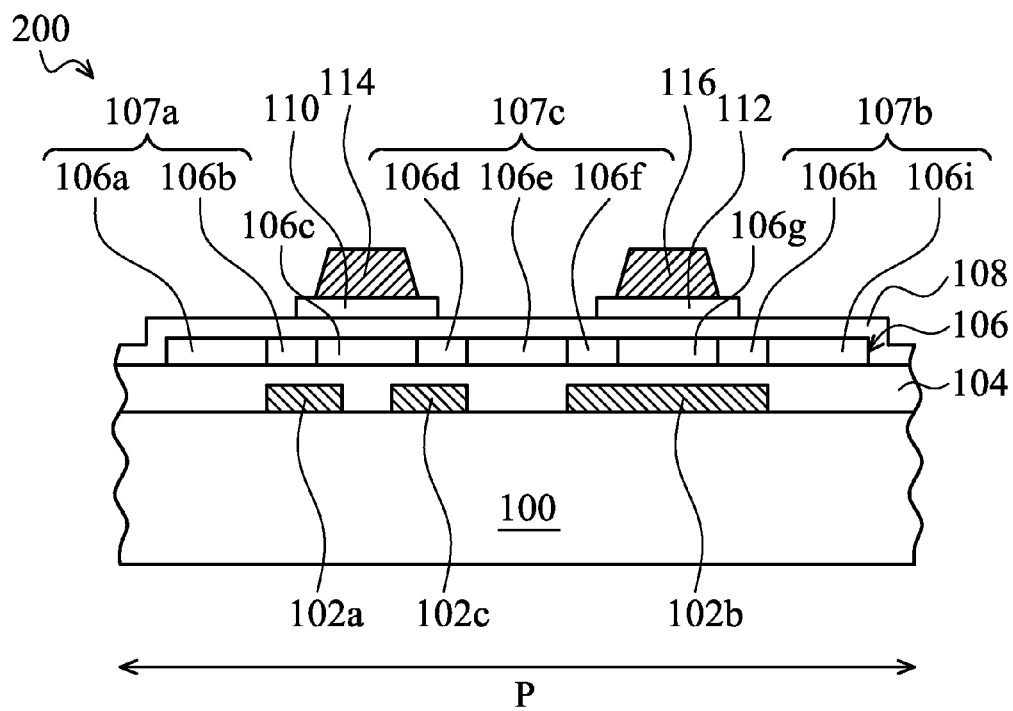

Referring to FIG. 5, unlike the embodiment shown in FIG. 2, the multi-gate TFT device 200 further comprise a separated third light-shielding layer 102c disposed between the first and second light-shielding layers 102a and 102b, corresponding to the third lightly doped region 106d, and laterally extending under at least portion of the first channel region 106c, thereby entirely shielding the third lightly doped region 106d and partially shielding the first channel region 106c from impingement. The third light-shielding layer 102c may be formed of the same or similar material as that of first and second light-shielding layers 102a and 102b. In another embodiment, the third light-shielding layer 102c may correspond to the fourth lightly doped region 106f and laterally extend under at least portion of the second channel region 106g, thereby entirely shielding the fourth lightly doped region 106f and partially shielding the second channel region 106g from impingement. In yet another embodiment, the second light-shielding layer 102b passes under a second channel region 106g to laterally extend under the fourth lightly doped region 106f, thereby entirely shielding the second channel region 106g and the fourth lightly doped region 106f, as shown in FIG. 6.

Figure 7:
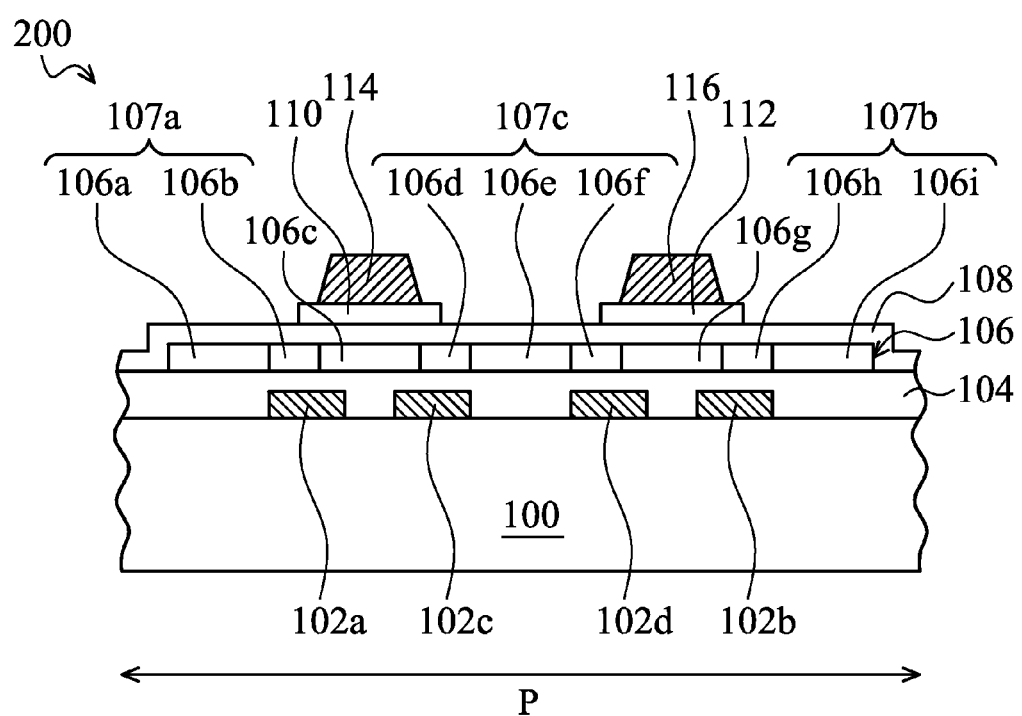

Referring to FIG. 7, unlike the embodiment shown in FIG. 5, the multi-gate TFT device 200 further comprises a separated fourth light-shielding layer 102d disposed between the first and second light-shielding layers 102a and 102b, corresponding to the fourth lightly doped region 106f, and laterally extending under at least portion of the second channel region 106g, thereby entirely shielding the fourth lightly doped region 106f and partially shielding the second channel region 106g from impingement. The fourth light-shielding layer 102d may be formed of the same or similar material as that of third light-shielding layer 102c.

In the embodiments shown in FIGS. 3 to 7, it can be understood that the separated light-shielding layers can mitigate the coupling effect, such that the threshold voltage is almost the same as the device is operated under a relatively low drain-source voltage and a relatively high drain-source voltage.

According to the foregoing embodiments, since the separated light-shielding layers are correspondingly disposed under the lightly doped regions of the source and drain regions in the active layer, photo leakage current in the active layer can be effectively reduced. Moreover, compared to the multi-gate TFT device where the active layer is entirely shielded from impingement, the multi-gate TFT device having separated light-shielding layers can mitigate the coupling effect between the light-shielding layer and the active layer, thereby preventing undesired threshold voltage shift, which results in abnormal display of the display device, as the device is operated under a relatively low drain-source voltage and a relatively high drain-source voltage.

Figure 9:
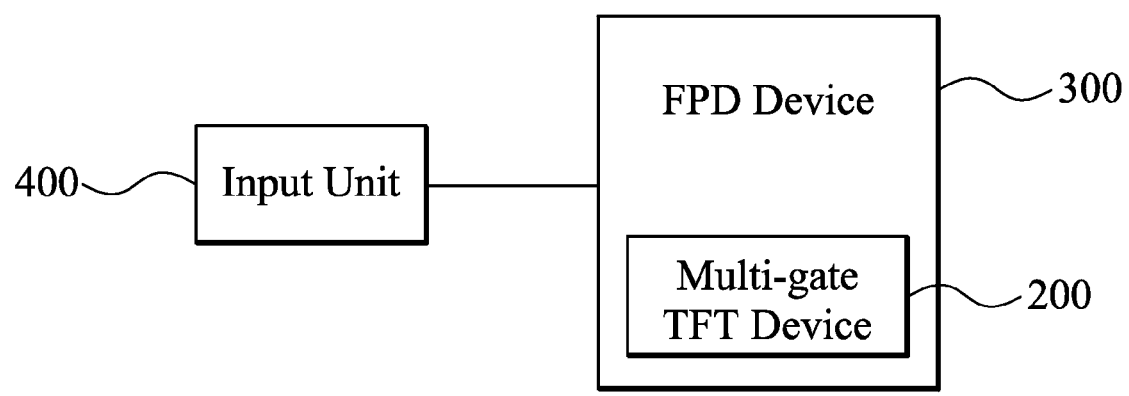
FIG. 9 schematically shows another embodiment of a system for displaying images.

FIG. 9 schematically shows another embodiment of a system for displaying images which, in this case, is implemented as a flat panel display (FPD) device 300 or an electronic device 500 such as a laptop computer, a mobile phone, a digital camera, a personal digital assistant (PDA), a desktop computer, a television, a car display or a portable DVD player. The FPD device 300 may comprise the described multi-gate TFT device 200, and the FPD device 300 may be a liquid crystal display (LCD) device. As shown in FIG. 9, the FPD device 300 comprises the multi-gate TFT device 200 as shown in FIGS. FIGS. 1 to 7. In some embodiments, the FPD device 300 can be incorporated into the electronic device 500. As shown in FIG. 9, the electronic device 500 comprises the FPD device 300 and an input unit 400. Moreover, the input unit 400 is coupled to the FPD device 300 and is operative to provide input signals (e.g. image signals) to the FPD 300 to generate images.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
a multi-gate thin film transistor device comprising:
a substrate having a pixel region;
an active layer disposed on the substrate in the pixel region, comprising a first source/drain region, a second source/drain region, a first channel region, a second channel region, and a channel connection region, wherein the first channel region adjoins a first lightly doped region of the first source/drain region with a third lightly doped region of the channel connection region, and the second channel region adjoins a second lightly doped region of the second source/drain region with a fourth lightly doped region of the channel connection region;
a first gate structure and a second gate structure disposed on the active layer and corresponding to the first and second channel regions, respectively, wherein the first and second gate structures are electrically connected to each other; and
a first light-shielding layer and a second light-shielding layer disposed between the substrate and the active layer,
wherein the first light-shielding layer corresponds to the first lightly doped region and laterally extends under at least a portion of the first channel region, and the second light-shielding layer corresponds to the second lightly doped region and laterally extends under at least a portion of the second channel region.

2. The system of claim 1, wherein the second light-shielding layer passes under the second channel region to laterally extend under the fourth lightly doped region.

3. The system of claim 2, wherein the first light-shielding layer passes under the first channel region to laterally extend under the third lightly doped region.

4. The system of claim 1, wherein the multi-gate thin film transistor device further comprises a third light-shielding layer between the first and second light-shielding layers, corresponding to the third lightly doped region, and laterally extending under at least a portion of the first channel region.

5. The system of claim 4, wherein the second light-shielding layer passes under the second channel region to laterally extend under fourth lightly doped region.

6. The system of claim 1, wherein the multi-gate thin film transistor device further comprises a third light-shielding layer and a fourth light-shielding layer between the first and second light-shielding layers, wherein the third light-shielding layer corresponds to the third lightly doped region and laterally extends under at least a portion of the first channel region, and the fourth light-shielding layer corresponds to the fourth lightly doped region and laterally extends under at least a portion of the second channel region.

7. The system of claim 6, wherein the third and fourth light-shielding layers comprise a metal or semiconductor material.

8. The system of claim 1, wherein the first and second light-shielding layers comprise a metal or semiconductor material.

9. The system of claim 2, wherein each of the first and second gate structures comprise a stack of a gate dielectric layer and a gate layer.

10. The system as claimed in claim 1, further comprising:
a flat panel display device comprising the multi-gate thin film transistor device; and
an input unit coupled to the flat panel display device and operative to provide input singles to the flat panel display device, such that the flat panel display displays images.

11. The system of claim 10, wherein the flat panel display device is a liquid crystal display device.

12. The system of claim 10, wherein the system is an electronic device comprising the flat panel display device.

13. The system of claim 12, wherein the electronic device is a laptop computer, a mobile phone, a digital camera, a personal digital assistant, a desktop computer, a television, a car display or a portable DVD player.

14. The system of claim 1, wherein the first channel region structurally connects the first lightly doped region of the first source/drain region to the third lightly doped region of the channel connection region, and the second channel region structurally connects the second lightly doped region of the second source/drain region to the fourth lightly doped region of the channel connection region, all within a same contiguous structure of the active layer.

15. The system of claim 14, wherein the third lightly doped region and the fourth lightly doped region are part of the same channel connection region.

16. The system of claim 1, wherein the first channel region is contiguous to the first lightly doped region of the first source/drain region and the third lightly doped region of the channel connection region, and the second channel region is contiguous to the second lightly doped region of the second source/drain region and the fourth lightly doped region of the channel connection region, all within a same contiguous structure of the active layer.

17. The system of claim 16, wherein the third lightly doped region and the fourth lightly doped region are part of the same channel connection region, separated by a heavily doped region of the channel region.

18. The system of claim 1, wherein the first lightly doped region of the first source/drain region, the first channel region, the third lightly doped region of the channel connection region, a heavily doped region of the channel connection region, the fourth lightly doped region of the channel connection region, the second channel region, and the second lightly doped region of the second source/drain region are connected in that order within a same contiguous structure of the active layer.

19. A system for displaying images, comprising:
a multi-gate thin film transistor device comprising:
a substrate having a pixel region;

an active layer disposed on the substrate in the pixel region, comprising a first source/drain region, a first channel region, a channel connection region, a second channel region and a second source/drain region connected in that order within the active layer, wherein the channel connection region is contiguously connected between first source/drain region and the second source/drain region, wherein the channel connection region comprises a first lightly doped region and a second lightly doped region, the first source/drain region comprises a first lightly doped region, and the second source/drain region comprises a second lightly doped region, and wherein the first lightly doped region of the channel connection region is contiguous to the first lightly doped region of the first source/drain region and the second lightly doped region of the channel connection region is contiguous to the second lightly doped region of the second source/drain region;

a first gate structure and a second gate structure disposed on the active layer and corresponding to the first and second channel regions, respectively, wherein the first and second gate structures are electrically connected to each other; and a first light-shielding layer and a second light-shielding layer disposed between the substrate and the active layer, wherein the first light-shielding layer corresponds to the first lightly doped region and laterally extends under at least a portion of the first channel region, and the second light-shielding layer corresponds to the second lightly doped region and laterally extends under at least a portion of the second channel region.

20. The system of claim 19, wherein the channel connection region further comprises a heavily doped region between the first lightly doped region and second lightly doped region of the channel connection region.

* * * * *